(12) United States Patent
Okamoto et al.

(10) Patent No.: US 8,914,766 B2
(45) Date of Patent: Dec. 16, 2014

(54) DOSE-DATA GENERATING APPARATUS

(71) Applicant: Kabushiki Kaisha Toshiba, Tokyo (JP)

(72) Inventors: Yosuke Okamoto, Mie (JP); Takashi Koike, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/932,023

(22) Filed: Jul. 1, 2013

(65) Prior Publication Data

US 2013/0298087 A1 Nov. 7, 2013

Related U.S. Application Data

(62) Division of application No. 13/168,215, filed on Jun. 24, 2011, now Pat. No. 8,504,951.

(30) Foreign Application Priority Data

Sep. 13, 2010 (JP) ................................. 2010-204437

(51) Int. Cl.
| | | |
|---|---|---|
| G06F 17/50 | (2006.01) | |
| G03H 3/00 | (2006.01) | |
| G03F 1/00 | (2012.01) | |
| H01L 21/67 | (2006.01) | |

(52) U.S. Cl.
CPC ...... *G06F 17/5081* (2013.01); *H01L 21/67253* (2013.01)
USPC ................. 716/136; 716/50; 716/51; 716/52; 716/53; 716/54; 716/55; 716/56; 430/3; 430/5

(58) Field of Classification Search
CPC ................................. G06F 17/5081; G03F 1/24

USPC ................................ 716/50–56, 136; 430/3, 5
See application file for complete search history.

(56) References Cited

U.S. PATENT DOCUMENTS

| | | | |
|---|---|---|---|
| 5,208,818 A | 5/1993 | Gelbart et al. | |
| 5,309,354 A * | 5/1994 | Dick | 700/57 |
| 5,521,036 A * | 5/1996 | Iwamoto et al. | 430/22 |
| 5,754,443 A | 5/1998 | Manabe | |
| 5,798,195 A | 8/1998 | Nishi | |
| 5,805,866 A * | 9/1998 | Magome et al. | 716/51 |
| 5,822,389 A | 10/1998 | Uzawa et al. | |
| 6,078,641 A | 6/2000 | Mitsui et al. | |
| 6,188,426 B1 | 2/2001 | Nakamura | |
| 6,280,887 B1 * | 8/2001 | Lu | 430/5 |
| 6,548,312 B1 | 4/2003 | Hayano et al. | |
| 7,050,716 B2 | 5/2006 | Nakaya et al. | |
| 7,191,423 B1 * | 3/2007 | Sze | 716/122 |
| 7,405,414 B2 * | 7/2008 | Sandstrom | 250/492.22 |

(Continued)

FOREIGN PATENT DOCUMENTS

| | | |
|---|---|---|
| JP | 2004-48018 | 2/2004 |
| JP | 2007-129101 | 5/2007 |
| JP | 2009-33025 | 2/2009 |

*Primary Examiner* — Helen Rossoshek
(74) *Attorney, Agent, or Firm* — Finnegan, Henderson, Farabow, Garrett & Dunner, L.L.P.

(57) ABSTRACT

According to one embodiment, generating virtual data by mirroring data based on a dimension measurement result in a measurement region on an inner side of a shot region to a non-shot region on an outer side of a shot edge, and calculating dose data of the measurement region and a non-measurement region based on data in the measurement region and the virtual data are included.

8 Claims, 8 Drawing Sheets

(56) References Cited

U.S. PATENT DOCUMENTS

| | | | |
|---|---|---|---|
| 7,406,675 B2 * | 7/2008 | Uzhakov et al. | 716/51 |
| 7,438,854 B2 | 10/2008 | Oshima | |
| 7,462,848 B2 * | 12/2008 | Parker | 250/492.23 |
| 7,691,540 B2 | 4/2010 | Yamaguchi et al. | |
| 7,712,071 B2 * | 5/2010 | Rosenbluth | 716/50 |
| 7,732,107 B2 | 6/2010 | Yao et al. | |
| 7,855,037 B2 * | 12/2010 | Kim | 430/5 |
| 7,927,773 B2 * | 4/2011 | Hakko | 430/30 |
| 8,187,773 B2 * | 5/2012 | Nakajima et al. | 430/5 |
| 8,223,317 B2 | 7/2012 | Hirano | |
| 8,312,393 B2 * | 11/2012 | Lindau et al. | 716/50 |
| 8,392,856 B2 * | 3/2013 | Misaka et al. | 716/55 |
| 8,492,205 B2 * | 7/2013 | Houston et al. | 438/129 |
| 8,566,756 B2 * | 10/2013 | Okita | 716/54 |
| 2005/0170267 A1 * | 8/2005 | Bleeker et al. | 430/5 |
| 2008/0068595 A1 * | 3/2008 | Hagiwara | 356/124 |
| 2009/0097002 A1 | 4/2009 | Fukuda et al. | |
| 2010/0211352 A1 * | 8/2010 | Morinaga et al. | 702/150 |
| 2012/0176590 A1 | 7/2012 | Noboru | |
| 2012/0202142 A1 * | 8/2012 | Nishio et al. | 430/5 |
| 2012/0208112 A1 | 8/2012 | Tanabe | |
| 2012/0250011 A1 * | 10/2012 | Itoh et al. | 356/237.5 |
| 2013/0140707 A1 * | 6/2013 | Misaka et al. | 257/773 |
| 2013/0208252 A1 * | 8/2013 | Suzuki et al. | 355/67 |

* cited by examiner

DIMENSION: LARGE
DIMENSION: SMALL

TO EXPOSURE APPARATUS

DOSE AMOUNT: LARGE
DOSE AMOUNT: SMALL

R2  R1

DIMENSION: LARGE
↕
DIMENSION: SMALL

A1

A1

DOSE AMOUNT: LARGE
↕
DOSE AMOUNT: SMALL

US 8,914,766 B2

DOSE-DATA GENERATING APPARATUS

CROSS-REFERENCE TO RELATED APPLICATIONS

This application is based upon and claims the benefit of priority from the prior Japanese Patent Application No. 2010-204437, filed on Sep. 13, 2010; the entire contents of which are incorporated herein by reference.

FIELD

Embodiments described herein relate generally to a dose-data generating apparatus.

BACKGROUND

In a photolithography process in a semiconductor manufacturing process, an exposure distribution (hereinafter, dose data) in a shot is changed in some cases for uniforming a pattern dimension in a shot on a wafer.

Specifically, in order to obtain the dose data, an amount of change of the pattern dimension when a dose amount is changed is measured in advance. Then, a dimension of a pattern is measured at a plurality of positions in a shot after wafer exposure, and the dose amount that uniforms the dimension at each point is calculated. Thereafter, typically, the dose data for uniforming the pattern dimension over the whole surface in the shot is expressed by an approximate function based on the dose amount. However, the function diverges at a shot edge such as a Kerf region and therefore indicates abnormal dose amount in some cases.

DETAILED DESCRIPTION

In general, according to one embodiment, a dose-data generating apparatus includes a virtual-data generating unit, a dose-data calculating unit and a shot-region cutout unit. The virtual-data generating unit generates virtual data by mirroring data based on a dimension measurement result in a measurement region on an inner side of a shot region to a non-shot region on an outer side of a shot edge. The dose-data calculating unit calculates dose data of the measurement region and a virtual measurement region for which the virtual data is generated based on data in the measurement region and the virtual data. The shot-region cutout unit cuts a shot region out of the measurement region and the virtual measurement region for which the dose data is calculated.

Exemplary embodiments of a dose-data generating apparatus and a dose-data generating method will be explained below in detail with reference to the accompanying drawings. The present invention is not limited to the following embodiments.

First Embodiment

Figure 1A:
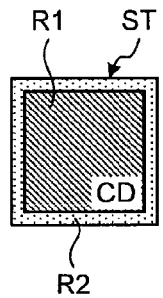
FIG. 1A to FIG. 1C are diagrams illustrating a flow of a dose-data generating method according to a first embodiment.
Figure 1B:
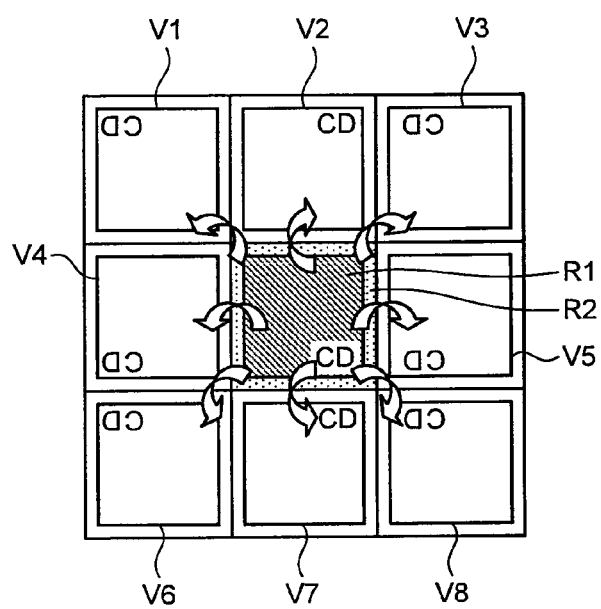
Figure 1C:
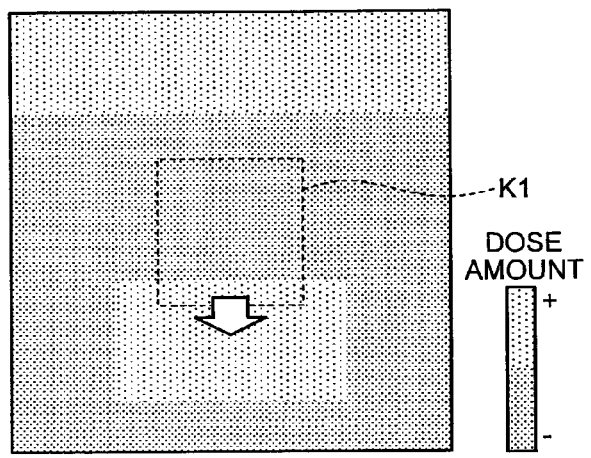

FIG. 1A to FIG. 1C are diagrams illustrating a flow of a dose-data generating method according to the first embodiment.

In FIG. 1A, in a shot region at the time of exposure, there is a measurement region R1 in which dimension measurement data CD can be obtained and a non-measurement region R2 in which the dimension measurement data cannot be obtained. The non-measurement region R2 is present around the measurement region R1. Examples of the non-measurement region R2 include a Kerf region in which a scribe line, an alignment mark, or the like is arranged. In the non-measurement region R2, a line & space for obtaining the dimension measurement data is not arranged.

The dimension measurement data CD of the measurement region R1 is mirrored to a non-shot region outside a shot edge ST to generate virtual data. For example, as shown in FIG. 1B, virtual measurement regions V1 to V8 can be generated in the non-shot region by mirroring the dimension measurement data CD of the measurement region R1 in eight directions.

Then, a desired dose amount, which is corrected so that the dimension at each point in the measurement region R1 and the virtual measurement regions V1 to V8 becomes uniform, is calculated based on the dimension measurement data CD of the measurement region R1 and the virtual data of the virtual measurement regions V1 to V8. Moreover, function approximation is performed on the dose amount calculated for each point, thereby enabling to calculate the dose amount (dose data) over the whole surface including the measurement region R1 and the virtual measurement regions V1 to V8.

Then, as shown in FIG. 1C, a shot region K1 is cut out of the measurement region R1 and the virtual measurement regions V1 to V8 for which the dose data is calculated, thereby enabling to obtain the dose data of the measurement region R1 and the non-measurement region R2.

After generating the virtual data by mirroring the dimension measurement data CD of the measurement region R1 to the non-shot region and obtaining data in the virtual measurement regions V1 to V8 in addition to the measurement region R1, an approximate function over the whole surface including the measurement region R1 and the virtual measurement regions V1 to V8 is obtained, so that the approximate function can be prevented from diverging at the shot edge and therefore jump value can be prevented from occurring in the dose amount at the shot edge.

Explanation is given for the case of mirroring the dimension measurement data CD itself as the data of the measurement region R1 when generating the virtual data, however, as described below, the virtual data can be generated by correcting and calculating a desired dose amount at each point in the measurement region R1 based on the dimension measurement data CD and then mirroring the calculated dose amounts to the non-shot region as data based on the dimension measurement result in the measurement region R1.

Figure 2A:
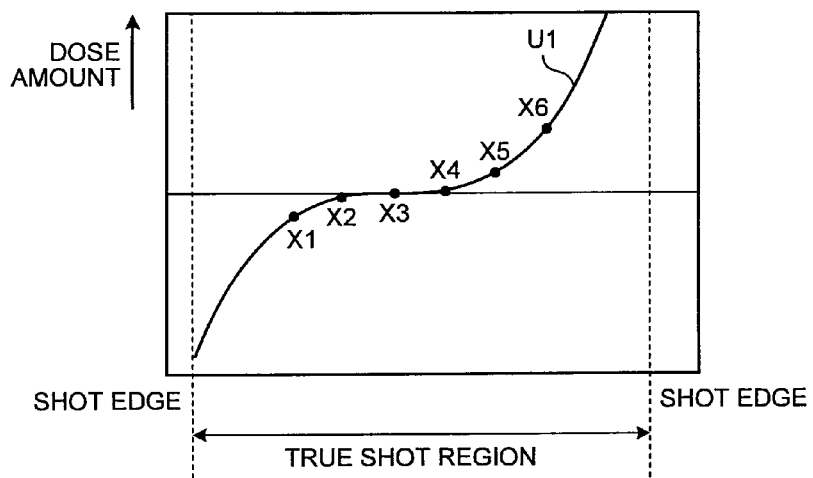
FIG. 2A is a diagram illustrating an approximate curve U1 obtained without mirroring data in a measurement region to a non-shot region.
Figure 2B:
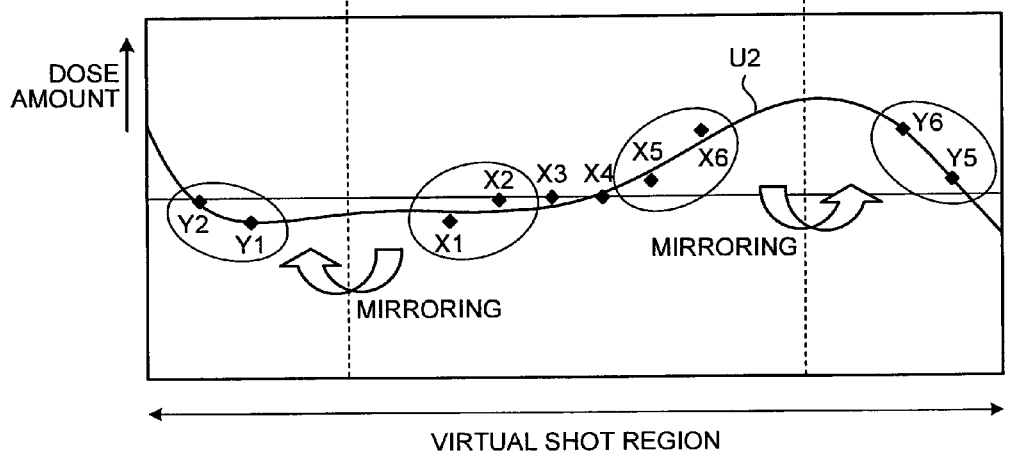
FIG. 2B is a diagram illustrating an approximate curve U2 obtained by mirroring the data in the measurement region to the non-shot region.

FIG. 2A is a diagram illustrating an approximate curve U1 obtained without mirroring the data in the measurement region to the non-shot region, and FIG. 2B is a diagram illustrating an approximate curve U2 obtained by mirroring the data in the measurement region to the non-shot region.

In FIG. 2A, desired dose amounts X1 to X6 corrected as data based on the dimension measurement result in the measurement region are obtained based on the dimension measurement data. At this time, the non-measurement region is present near the shot edge, so that a desired dose amount cannot be obtained.

If the approximate curve U1 is obtained from these desired dose amounts X1 to X6, the approximate curve U1 monotonically decreases or monotonically increases near the shot edges, so that the approximate curve U1 diverges and jump value occurs in the dose amount at the shot edges.

On the other hand, in FIG. 2B, desired dose amounts Y1 and Y2 as the virtual data are generated by mirroring the desired dose amounts X1 and X2 to the non-shot region outside the shot edge. Moreover, desired dose amounts Y5 and Y6 as the virtual data are generated by mirroring the desired dose amounts X5 and X6 to the non-shot region outside the shot edge.

When the approximate curve U2 is obtained from the desired dose amounts X1 to X6 and the virtual data Y1, Y2, Y5, and Y6, the approximate curve U2 can be prevented from diverging near the shot edge and jump value can be prevented from occurring in the dose amount at the shot edge.

Second Embodiment

FIG. 3A to FIG. 3D are diagrams illustrating a flow of a dose-data generating method according to the second embodiment.

Figure 3A:
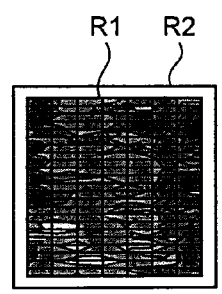
FIG. 3A to FIG. 3D are diagrams illustrating a flow of a dose-data generating method according to a second embodiment.

In FIG. 3A, in the measurement region R1, an in-plane distribution (dimension map) of the dimension measurement data is obtained. This dimension map can be obtained by actually measuring the dimension of a pattern actually formed on a wafer or can be obtained by simulating the dimension of a pattern formed on a wafer.

Figure 3B:
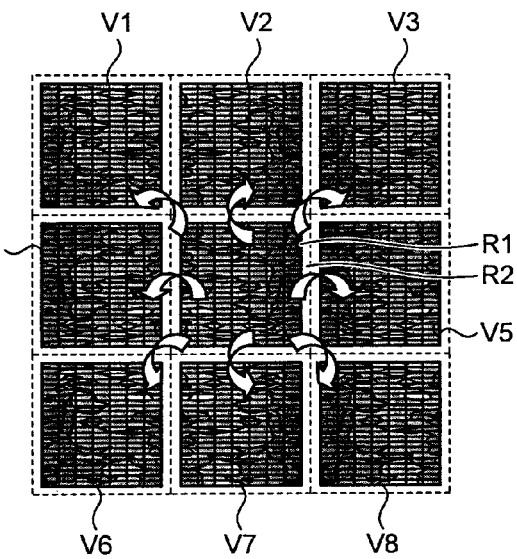

Next, as shown in FIG. 3B, the virtual data is generated in the virtual measurement regions V1 to V8 outside the shot by mirroring the dimension measurement data to the outside of the shot.

Figure 3C:
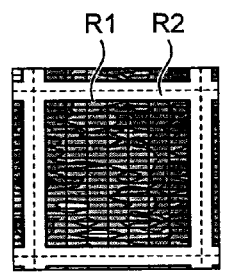

Next, as shown in FIG. 3C, a calculation region, in which function approximation is performed from the measurement region R1 and the virtual measurement regions V1 to V8, is set.

Figure 3D:
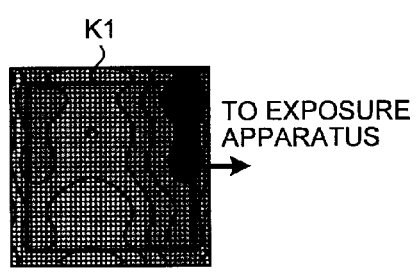

Next, as shown in FIG. 3D, after calculating a desired dose amount at each point of the measurement region R1 and the virtual measurement regions V1 to V8, function approximation calculation is performed in the calculation region set in FIG. 3C to calculate the dose data. The dose data of the measurement region R1 and the non-measurement region R2 can be obtained by cutting a shot region K1 out of the calculation region for which the dose data is calculated.

Figure 4A:
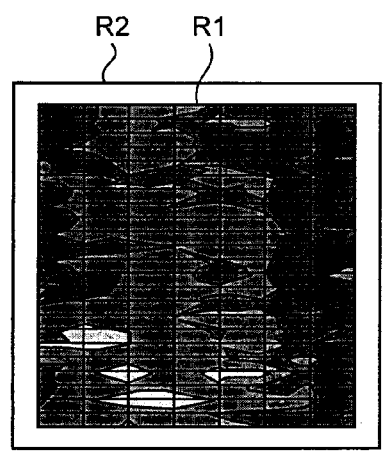
FIG. 4A is a diagram illustrating an in-plane distribution of dimension measurement data.
Figure 4B:
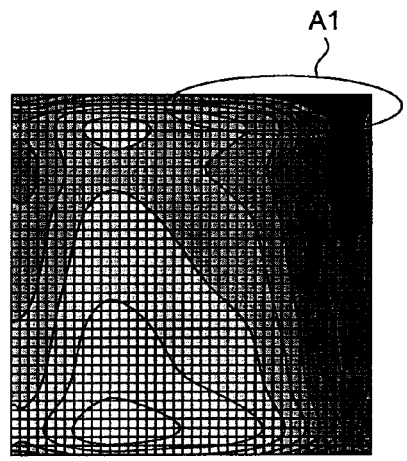
FIG. 4B is a diagram illustrating an in-plane distribution of a dose amount obtained without mirroring the dimension measurement data in FIG. 4A to the non-shot region.
Figure 4C:
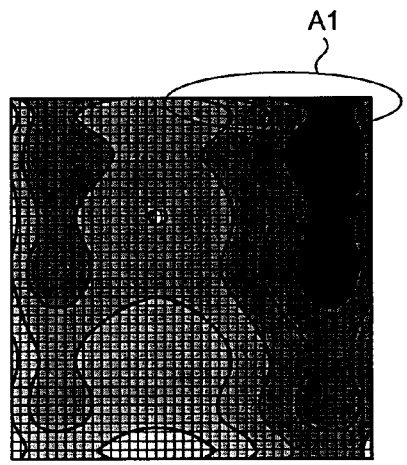
FIG. 4C is a diagram illustrating an in-plane distribution of a dose amount obtained by mirroring the dimension measurement data in FIG. 4A to the non-shot region.

FIG. 4A is a diagram illustrating the in-plane distribution of the dimension measurement data, FIG. 4B is a diagram illustrating the in-plane distribution of the dose amount obtained without mirroring the dimension measurement data in FIG. 4A to the non-shot region, and FIG. 4C is a diagram illustrating the in-plane distribution of the dose amount obtained by mirroring the dimension measurement data in FIG. 4A to the non-shot region.

In FIG. 4B, if the dose amount is calculated only from the dimension measurement data of the measurement region R1, jump value occurs in the dose amount in a portion A1 at the shot edge.

On the other hand, in FIG. 4C, if the dose amount is calculated from the dimension measurement data of the measurement region R1 and the virtual data of the virtual measurement regions V1 to V8, jump value is prevented from occurring in the dose amount in the portion A1 at the shot edge.

Third to Fifth Embodiments

Figures 5A, 5B:
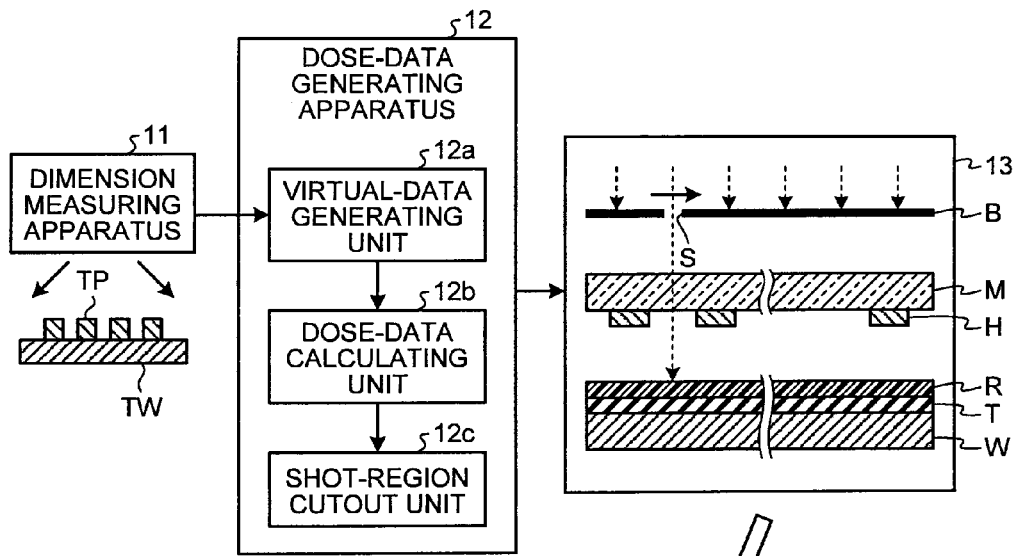
FIG. 5A is a block diagram illustrating a schematic configuration of a dose-data generating apparatus according to a third embodiment.
FIG. 5B is a cross-sectional view illustrating a schematic configuration of an exposure method according to a fourth embodiment.
Figure 5C:
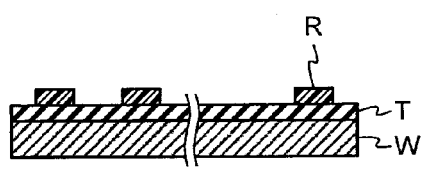
FIG. 5C and FIG. 5D are cross-sectional views illustrating a manufacturing method of a semiconductor device according to a fifth embodiment.
Figure 5D:
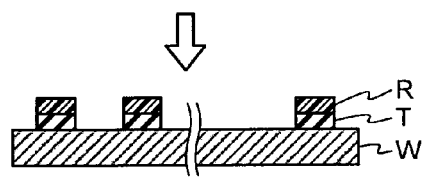

FIG. 5A is a block diagram illustrating a schematic configuration of a dose-data generating apparatus according to the third embodiment, FIG. 5B is a cross-sectional view illustrating a schematic configuration of an exposure method according to the fourth embodiment, and FIG. 5C and FIG. 5D are cross-sectional views illustrating a manufacturing method of a semiconductor device according to the fifth embodiment.

In FIG. 5A, a dose-data generating apparatus 12 includes a virtual-data generating unit 12a, a dose-data calculating unit 12b, and a shot-region cutout unit 12c. The virtual-data generating unit 12a can generate the virtual data by mirroring the dimension measurement data or a desired dose amount to the non-shot region outside the shot edge. The dose-data calculating unit 12b can calculate the dose data of the measurement region of the dimension measurement data and the virtual measurement region connectedly based on the dimension measurement data and the virtual data. The shot-region cutout unit 12c can cut the shot region out of the measurement region and the virtual measurement region for which the dose data is calculated.

The dimension measurement data is obtained by measuring the dimension of a test pattern TP formed on a test wafer TW by a dimension measuring apparatus 11, and the obtained dimension measurement data is input to the virtual-data generating unit 12a.

In the virtual-data generating unit 12a, the virtual data is generated by mirroring the dimension measurement data or a desired dose amount to the non-shot region and is sent to the dose-data calculating unit 12b.

In the dose-data calculating unit 12b, the dose data of the measurement region of the dimension measurement data and the virtual measurement region is calculated connectedly based on the dimension measurement data and the virtual data and is sent to the shot-region cutout unit 12c.

In the shot-region cutout unit 12c, the shot region is cut out of the measurement region and the virtual measurement region for which the dose data is calculated and is sent to an exposure apparatus 13.

In FIG. 5B, in the exposure apparatus 13, a light shielding plate B and a photomask M are provided. In the light shielding plate B, a slit S is provided. The slit S is horizontally slidable over the wafer W. The width of the slit S can be adjusted to a predetermined interval and the speed of sliding the slit S during exposure can be changed, so that the light intensity to be transmitted through the slit S can be changed. On the other hand, a light shielding film H is formed on the photomask M.

Moreover, on the wafer W, a resist film R is formed via a process layer T. The process layer T can be a conductive layer, a semiconductor layer, or a dielectric layer, and can be appropriately selected according to a process performed on the process layer T. The process performed on the process layer T can be, for example, an etching process or an ion implantation process.

When the wafer W on which the resist film R is formed via the process layer T is arranged in the exposure apparatus 13 in a state where the photomask M on which the light shielding film H is formed is arranged in the exposure apparatus 13, exposure of the resist film R is performed via the photomask M while the exposure distribution is controlled by the light shielding plate B.

Then, as shown in FIG. 5C, the resist film R on which the exposure is performed in the exposure apparatus 13 is developed, whereby the resist film R is patterned.

Next, as shown in FIG. 5D, the process layer T is etched with the patterned resist film R as a mask, whereby the process layer T is patterned and thus, for example, a wiring pattern, a trench pattern, or a contact pattern is formed on the wafer W.

The exposure method of the present embodiments can be applied to an exposure system in which the dose-data generating apparatus 12 is incorporated together with the exposure apparatus 13.

Sixth Embodiment

Figure 6:
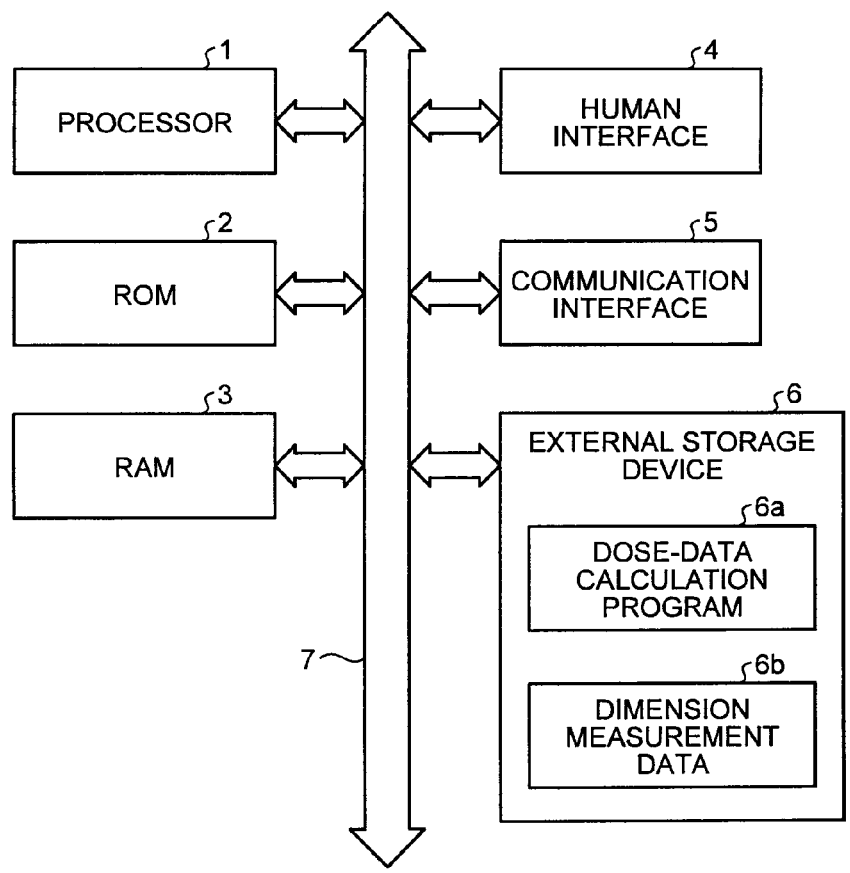
FIG. 6 is a block diagram illustrating a schematic configuration of a dose-data generating apparatus according to a sixth embodiment.

FIG. 6 is a block diagram illustrating a schematic configuration of a dose-data generating apparatus according to the sixth embodiment.

In FIG. 6, in the dose-data generating apparatus, it is possible to provide a processor 1 including a CPU and the like, a ROM 2 that stores therein fixed data, a RAM 3 that provides a work area and the like to the processor 1, a human interface 4 that interfaces between a human and a computer, a communication interface 5 that provides communication means to the outside, and an external storage device 6 that stores therein programs for operating the processor 1 and various data, and the processor 1, the ROM 2, the RAM 3, the human interface 4, the communication interface 5, and the external storage device 6 are connected via a bus 7.

As the external storing device 6, for example, a magnetic disk such as a hard disk, an optical disc such as a DVD, a portable semiconductor storage device such as a USB memory and a memory card can be used. Moreover, as the human interface 4, for example, a keyboard, a mouse, or a touch panel as an input interface, a display or a printer as an output interface, or the like can be used. Furthermore, as the communication interface 5, for example, a LAN card, a modem, or a router for connecting to the Internet, LAN, or the like can be used.

In the external storage device 6, a dose-data calculation program 6a is installed. Moreover, in the external storage device 6, dimension measurement data 6b can be stored.

When the dose-data calculation program 6a is started, the dimension measurement data 6b is mirrored to the non-shot region by the processor 1, whereby the virtual data is generated. Then, the dose data of the measurement region of the dimension measurement data 6b and the non-measurement region is calculated connectedly based on the dimension measurement data 6b and the virtual data.

Seventh Embodiment

Figure 7:
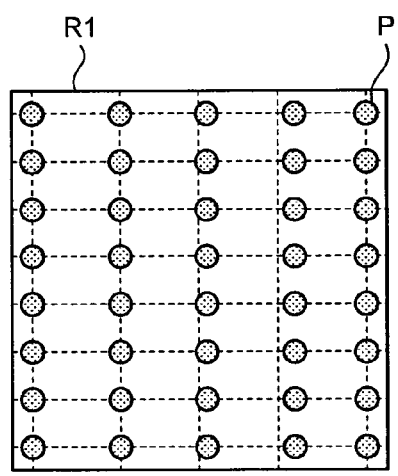
FIG. 7 is a plan view illustrating an in-plane distribution of dimension measurement points according to a seventh embodiment.
Figure 8A:
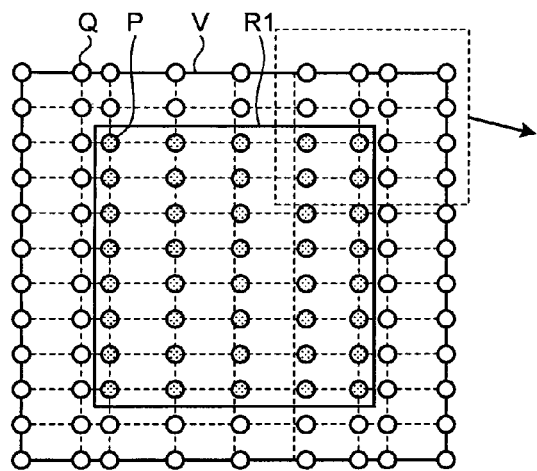
FIG. 8A is a plan view illustrating an in-plane distribution of dimension extrapolation points according to the seventh embodiment.
Figure 8B:
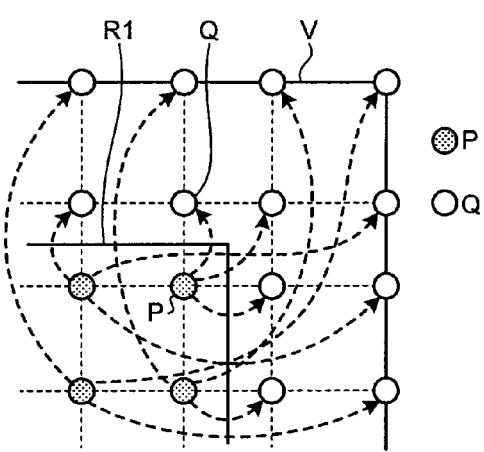
FIG. 8B is a plan view illustrating a part in FIG. 8A in an enlarged scale.
Figure 9:
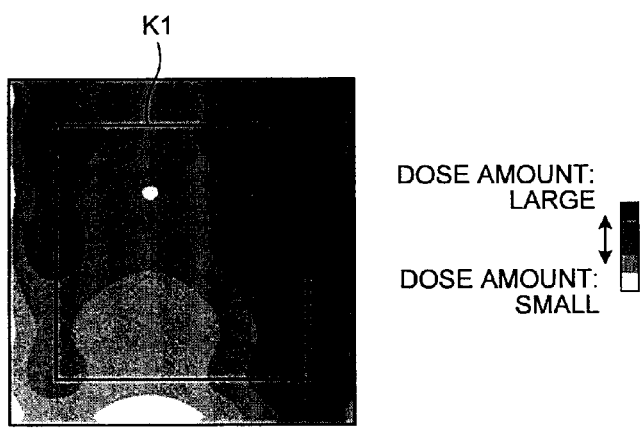
FIG. 9 is a diagram illustrating an in-plane distribution of a dose amount according to the seventh embodiment.
Figure 10:
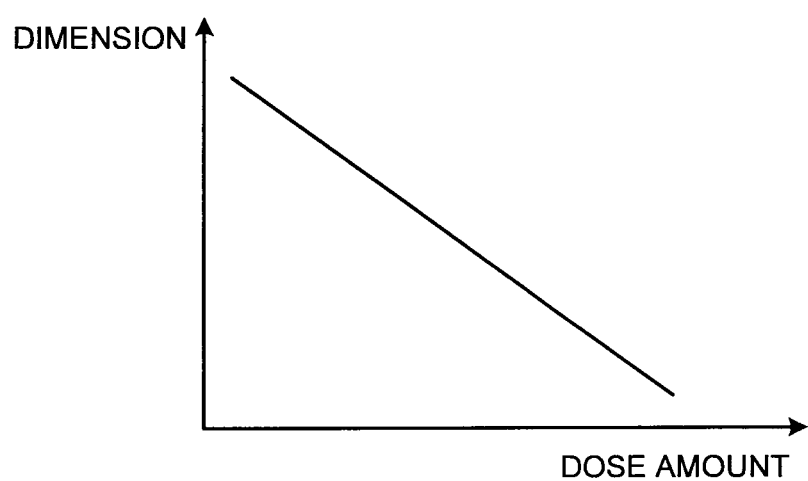
FIG. 10 is a diagram illustrating a relationship between a dose amount and a dimension.

FIG. 7 is a plan view illustrating an in-plane distribution of dimension measurement points according to the seventh embodiment, FIG. 8A is a plan view illustrating an in-plane distribution of dimension extrapolation points according to the seventh embodiment, FIG. 8B is a plan view illustrating a part in FIG. 8A in an enlarged scale, FIG. 9 is a diagram illustrating the in-plane distribution of the dose amount according to the seventh embodiment, and FIG. 10 is a diagram illustrating a relationship between the dose amount and the dimension.

In FIG. 7, in the measurement region R1, the in-plane distribution (dimension map) of dimension measurement data P at M×N (M and N are positive integers) points is obtained. In the example in FIG. 7, the case is illustrated in which the dimension measurement data P at 5×8 points is obtained. This dimension map can be obtained by actually measuring a dimension of a pattern actually formed on a wafer or can be obtained by simulating a dimension of a pattern formed on a wafer.

Next, as shown in FIGS. 8A and 8B, the dimension measurement data P for "a" points ("a" is an integer equal to or less than M or N for each broken line in FIGS. 8A and 8B) of the measurement region R1 is mirrored to a non-shot region V to generate virtual data Q in the non-shot region V. At this time, the position of the dimension measurement data P as a mirroring source and the position of the virtual data Q as a mirroring destination can be set equal in distance from the shot edge.

Moreover, as shown in FIG. 10, the relationship between the dose amount and the dimension is examined in advance for each exposure apparatus. Then, the dose amount at each point is corrected and calculated so that the dimension matches a target value from the dimension map in which the virtual data Q is added to the non-shot region V by referring to the relationship between the dose amount and the dimension in FIG. 10.

Then, as shown in FIG. 9, the function approximation is performed over the whole surface in the shot and out of the shot based on the dose amount at each point to calculate the dose data, and thereafter the shot region K1 is cut out.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A dose-data generating apparatus comprising:
a processor; and a non-transitory computer-readable storage medium storing a program that, when executed, causes the processor to:
  generate virtual measurement data by mirroring dimension measurement data in a measurement region on an, inner side of a shot region at a time of exposure to a non-shot region on an outer side of a shot edge of the shot region,
  calculate dose data of the measurement region and a non-measurement region of the dimension measurement data connectedly based on the dimension measurement data and the virtual measurement data, and
  cut the shot region out of the measurement region and the non-measurement region for which the dose data is calculated.

2. The dose-data generating apparatus according to claim 1 wherein the program further causes the processor to calculate the dose data from an approximation function obtained based on the dimension measurement data and the virtual measurement data.

3. The dose-data generating apparatus according to claim 1, wherein the program further causes the processor to mirror the dimension measurement data of the measurement region in eight directions.

4. The dose-data generating apparatus according to claim 3, wherein a position of the dimension measurement data as a mirroring source and a position of the virtual measurement data as a mirroring destination are equal in distance from the shot edge.

5. A dose-data generating apparatus comprising:
  a processor; and
  a non-transitory computer-readable storage medium storing a program that, when executed, causes the processor to:
    generate virtual dose data by calculating dose data of a measurement region of dimension measurement data on an inner side of a shot region at a time of exposure, based on the dimension measurement data and mirroring the dose data to a non-shot region on an outer side of a shot edge of the shot region,
    calculate dose data of the measurement region and a non-measurement region of the dimension measurement data connectedly based on the dose data of the measurement region and the virtual dose data of the non-shot region, and
    cut the shot region out of the measurement region and the non-measurement region for which the dose data is calculated.

6. The dose-data generating apparatus according to claim 5, wherein the program further causes the processor to calculate the dose data of the measurement region and the non-measurement region from an approximate function obtained based on the dose data of the measurement region and the virtual dose data of the non-shot region.

7. The dose-data generating apparatus according to claim 5, wherein the program further causes the processor to mirror the dose data of the measurement region in eight directions.

8. The dose-data generating apparatus according to claim 7, wherein a position of the dose data as a mirroring source and a position of the virtual dose data as a mirroring destination are equal in distance from the shot edge.

* * * * *

UNITED STATES PATENT AND TRADEMARK OFFICE
CERTIFICATE OF CORRECTION

| | |
|---|---|
| PATENT NO. | : 8,914,766 B2 |
| APPLICATION NO. | : 13/932023 |
| DATED | : December 16, 2014 |
| INVENTOR(S) | : Okamoto et al. |

It is certified that error appears in the above-identified patent and that said Letters Patent is hereby corrected as shown below:

In the Claims

Claim 1, column 7, lines 5-6, change "region on an, inner side" to --region on an inner side--.

Claim 5, column 8, line 6, change "exposure," to --exposure--.

Signed and Sealed this
Twenty-eighth Day of April, 2015

Michelle K. Lee
*Director of the United States Patent and Trademark Office*